(12) United States Patent
Ohmori et al.

(10) Patent No.: US 8,331,136 B2
(45) Date of Patent: Dec. 11, 2012

(54) RECORDING METHOD OF NONVOLATILE MEMORY AND NONVOLATILE MEMORY

(75) Inventors: Hiroyuki Ohmori, Kanagawa (JP); Tetsuya Yamamoto, Kanagawa (JP); Masanori Hosomi, Kanagawa (JP); Yutaka Higo, Kanagawa (JP); Kazutaka Yamane, Kanagawa (JP); Kazuhiro Bessho, Kanagawa (JP); Hiroshi Kano, Kanagawa (JP); Minoru Ikarashi, Kanagawa (JP); Yuki Oishi, Kanagawa (JP); Shinichiro Kusunoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 266 days.

(21) Appl. No.: 12/821,886

(22) Filed: Jun. 23, 2010

(65) Prior Publication Data

US 2010/0328993 A1    Dec. 30, 2010

(30) Foreign Application Priority Data

Jun. 25, 2009  (JP) .................. P2009-151514

(51) Int. Cl.
*G11C 11/15* (2006.01)
(52) U.S. Cl. ........................... 365/158; 365/173
(58) Field of Classification Search .................. 365/158, 365/173
See application file for complete search history.

(56) References Cited

U.S. PATENT DOCUMENTS

| 7,242,469 B2 | 7/2007 | Wang et al. |
| 2008/0265907 A1* | 10/2008 | Wienchol ...................... 324/550 |

FOREIGN PATENT DOCUMENTS

| JP | 2003-17782 | 1/2003 |
| JP | 2004-363604 | 12/2004 |

OTHER PUBLICATIONS

F.J. Albert et al., Applied Physics Letters., "Spin-Polarized Current Switching of a Co Thin Film Nanomagnet" vol. 77, p. 3809, 2000.

* cited by examiner

*Primary Examiner* — Michael Tran
(74) *Attorney, Agent, or Firm* — K&L Gates LLP

(57) ABSTRACT

A recording method of a nonvolatile memory including a recording circuit that electrically performs recording of information for an information memory device having a resistance change connected to a power supply for information recording, includes the steps of: recording information in a low-resistance state by the recording circuit under a condition that an output impedance of the recording circuit for the information memory device is larger than a resistance value in the low-resistance state of the information memory device; and recording information in a high-resistance state by the recording circuit under a condition that an output impedance of the recording circuit for the information memory device is smaller than a resistance value in the high-resistance state of the information memory device.

5 Claims, 9 Drawing Sheets

RECORDING METHOD OF NONVOLATILE MEMORY AND NONVOLATILE MEMORY

CROSS REFERENCES TO RELATED APPLICATIONS

The present application claims priority to Japanese Priority Patent Application JP 2009-151514 filed in the Japan Patent Office on Jun. 25, 2009, the entire contents of which is hereby incorporated by reference.

BACKGROUND

The present application relates to a nonvolatile memory using a magnetic material having a resistance change or the like, for example, as an information memory device and a recording method.

In an information device such as a computer, a DRAM (Dynamic Random Access Memory) that operates faster with higher density is widely used as a random access memory (RAM: Random Access Memory). However, since the DRAM is a volatile memory in which recorded information is lost when power supply is turned off, a nonvolatile memory in which information is left is desired.

Accordingly, as a candidate of the nonvolatile memory, a magnetoresistive random access memory (MRAM) that records information using magnetization of a magnetic material attracts attention.

In the MRAM, minute information memory devices that memorize information are regularly arranged and wired so that each of them may be accessible, and the wiring has a structure in which word lines and bit lines are provided, for example. Each information memory device has a memory layer in which information is memorized as a magnetization direction of ferromagnetic material.

Further, for the information memory device, a magnetic memory device that employs a structure using so-called magnetic tunnel junction (MTJ) is used. The magnetic tunnel junction includes the above described memory layer, a tunnel insulating film (nonmagnetic spacer film), and a magnetization fixed layer in which a magnetization direction is fixed. The magnetization direction in the magnetization fixed layer may be fixed by providing an antiferromagnetic layer, for example.

In the structure, so-called tunnel magnetic resistance effect that a resistance value for a tunnel current flowing in the tunnel insulating film changes depending on the angle formed by the magnetization direction of the memory layer and the magnetization direction of the magnetization fixed layer occurs. Using the tunnel magnetic resistance effect, readout of information can be performed. The magnitude of the resistance value takes the maximum value when the magnetization direction of the memory layer and the magnetization direction of the magnetization fixed layer are anti-parallel and takes the minimum value when they are in parallel.

A method of storing information in the information memory device (hereinafter, may be abbreviated as "writing of information" or "writing") is performed in the following manner. That is, the magnetization direction of the memory layer of the information memory device is switched between a low-resistance state and a high-resistance state using a synthetic current magnetic field generated when currents are allowed to flow in both the word lines and the bit lines orthogonally arranged on and under the information memory device. Further, writing of information is performed using a difference of at least two resistance values. Generally, the difference between directions of magnetization (magnetization states) is stored in the information memory device in correspondence with "0" information and "1" information, respectively, at writing of information. In this manner, "0" information and "1" information are written by reversing the magnetization directions of the memory layer of including ferromagnetic matarial, high-speed and nearly infinite (>$10^{15}$ times) rewriting can be performed.

On the other hand, readout of written information (hereinafter, may be abbreviated as "readout of information" or "readout") is performed in the following manner. That is, selection of a memory cell is performed using an element such as a transistor and the difference between the magnetization directions of the memory layer is detected as a difference between voltage signals using the tunnel magnetic resistance effect of the information memory device. Thereby, the written information can be sensed.

However, in the MRAM, since address wiring for writing and address wiring for readout are necessary with respect to each information memory device, miniaturization of the memory cell is structurally difficult. Further, to rewrite the once written information, it is necessary to generate a relatively large current magnetic field and flow large currents to some degree (e.g., several milliamperes to several tens of milliamperes) in the address wirings. Thus, power consumption becomes greater. Furthermore, with miniaturization of the information memory device, also the address wirings become thinner, and it may be difficult to flow sufficient currents and the power consumption may increase because coercivity becomes larger and the necessary current magnetic field increases.

Accordingly, a memory having a configuration using magnetization reversal by spin transfer (also called "spin injection torque") as a memory that enables magnetization reversal with less current, not depending on the current magnetic field, for storing information attracts attention. The magnetization reversal by spin transfer is to inject spin-polarized electrons while passing through a magnetic material into another magnetic material and cause magnetization reversal in the other magnetic material (e.g., see JP-A-2003-17782 and F. J. Albert et al., Applied Physics. Letters. Vol. 77, 2002, p. 3809).

This phenomenon is that, when the spin-polarized electrons that have passed through the magnetic layer with fixed magnetization direction (magnetization fixed layer) enters another magnetic layer without fixed magnetization direction (magnetization free layer), the electrons provide torque to the magnetization of the magnetic layer. Then, a current larger than a certain threshold level is flown in the other magnetic material, and thereby, the magnetization direction of the magnetic layer (magnetization free layer) can be reversed.

For example, a current is flown in a giant magneto resistive head (GMR element) or a magnetic tunnel junction element (MTJ element) having a magnetization fixed layer and a magnetization free layer in a direction perpendicular to its film surface. Thereby, the magnetization direction of at least a part of the magnetic layer of these elements can be reversed.

Further, an information memory device having a magnetization fixed layer and a magnetization free layer (memory layer) is formed and the polarity of a current flown in the information memory device is changed, and thereby, the magnetization direction of the memory layer is reversed and the low-resistance state and the high-resistant state are switched. Using the difference between the two resistance values, rewriting between "0" information and "1" information is performed.

On the other hand, readout of the written information can use the tunnel magnetic resistance effect like the MRAM by providing a tunnel insulating layer between a magnetization fixed layer and a magnetization free layer (memory layer).

The magnetization reversal by spin transfer has an advantage that, even when the information memory device is miniaturized, magnetization reversal can be realized without increase of current.

The absolute value of the current flown in the information memory device for magnetization reversal is 1 mA or less for the information memory device on the scale of about 0.1 μm, for example, decreases in proportion to the volume of the information memory device, and thus, that is advantageous in scaling. In addition, there is an advantage that word lines for memory, which are necessary in the MRAM, are not necessary and the configuration of the memory cell becomes simpler.

As below, an information memory device using spin transfer is called a spin MRAM (spin transfer random access memory). Further, a spin-polarized electron flow causing spin transfer is called a spin injection current. Great expectations are placed on the spin MRAM as a nonvolatile memory that enables lower power consumption and larger volume while maintaining the advantage of the MRAM that can realize high-speed and nearly infinite rewriting.

Further, a memory called an RRAM (resistance RAM) having a thin oxide between electrodes for changing the state of the oxide and performing recording by applying an electric field to the oxide and changing the electric resistance between the electrodes has been developed (e.g., see JP-A-2004-363604).

A nonvolatile memory in which information memory devices that can store information for long periods as electrical or structural changes are integrated mainly has two mechanisms. They are a mechanism of recording electric information in the information memory devices and a mechanism of reading out the accumulated information as a difference between at least two resistance values of electrically low-resistance state and high-resistance state. By applying a voltage, the difference between two potentials of a low-parallel magnetization state and an anti-parallel magnetization state is reduced and a magnetization change (reversal) occurs at a certain moment.

SUMMARY

On the other hand, in a nonvolatile memory accompanied by a resistance change such as a spin MRAM or RRAM, to write information, a writing current is flown in the stacked direction of the information memory devices. In this regard, a voltage is applied to a thin oxide layer (tunnel barrier layer) in about 1 μm that forms the information memory device, and, if an excessive voltage is applied, the information memory device breaks down. Alternatively, even when the element does not immediately break down, if recording operations are repeated, the element becomes nonfunctional such that the element becomes less recordable and the resistance value changes (decreases) and information readout errors increases. Furthermore, problems that recording is not performed unless a sufficient voltage is applied and recording is insufficient arise.

Thus, it is desirable to realize long-life and highly-reliable recording while suppressing destruction and shortening of life of information memory device due to recording in a nonvolatile memory that performs recording resistance changes caused by magnetic, electric or structural changes as information.

Generally, constant-voltage recording is performed when recording is performed in an information memory device accompanied by a resistance change.

For example, when recording is performed with constant-voltage, in the process of performing recording at voltage V while the element is changed from the high-resistance state (resistance $R_H$) to the low-resistance state (resistance $R_L$), a current of $V/R_H$ flows in the information memory device in the initial state. The recording is performed while the voltage is applied, in the recorded state, the current flowing in the information memory device is $V/R_L$ and $R_H > R_L$, and then, the flowing current increases after recording. Since the recording time is typically constant, the load on the information memory device becomes larger after recording and destruction of the information memory device becomes easier to occur. On the other hand, when recording is performed with a constant current, the voltage V applied to the information memory device is $I \cdot R_H$ before recording and $I \cdot R_L$ after recording, and the voltage after recording becomes lower and the load on the information memory device becomes smaller.

However, when recording is performed while the element is changed from the low-resistance state to the high-resistance state, the load changes are opposite to those in the above described case, and the load on the information memory device is smaller in the case of recording with the constant voltage. As described above, the inventors of this application have found that destruction of the information memory device can be suppressed by selectively using recording with a constant voltage and with a constant current according to the difference of recording information.

That is, for a nonvolatile memory including information memory devices accompanied by resistance changes, recording using a constant current is performed when the low-resistance state information of the information memory devices is recorded and recording using a constant voltage is performed when the high-resistance state information of the information memory devices is recorded. This is preferable as a recording method, however, needs a complex recording circuit. Accordingly, when recording is performed in a nonvolatile memory including a mechanism of recording electric information in the information memory devices and a mechanism of reading out the accumulated information as a difference between at least two resistance values of electrically low-resistance state and high-resistance state, in the case where information in the low-resistance state is recorded in the information memory devices, the output impedance of the recording circuit is made larger than the resistance value of the low-resistance state, and, in the case where information in the high-resistance state is recorded in the information memory devices, the output impedance of the recording circuit is made smaller than the resistance value of the high-resistance state. When the recording conditions are satisfied, the equal effects as those of the recording method using the constant-current recording and constant-voltage recording can be obtained and realized using a simpler circuit configuration.

When information in the low-resistance state is recorded in the information memory devices, control of the recording is performed by current control, and, when information in the high-resistance state is recorded in the information memory devices, control of the recording is performed by voltage control. In this regard, it is preferable that constant-current recording is performed when the information in the low-resistance state is recorded and constant-voltage recording is performed when the information in the high-resistance state is recorded.

Further, it is preferable that, when information to be recorded is determined depending on the positive or negative polarity of the recording voltage, recording is performed on one polarity by current control and on the other polarity by voltage control.

A specific recording circuit that realizes the control has the following configuration.

(1) To two wirings (e.g., a bit line and a word line) for energizing a particular element that can be arbitrarily selected among a group of information memory devices forming the nonvolatile memory, the particular element is connected directly or via MOS transistors (switching elements).

(2) Two or more MOS transistors are connected for changing a potential of at least one of the bit line or the word line connected to the electrodes of the particular element or the particular element.

(3) At least two of the MOS transistors are directly connected to the electrodes of the particular element or the word line and the bit line, and one of them is connected to a high-potential power supply line and the other one is connected to a low-potential power supply line via a resistance element or a MOS transistor.

The MOS transistor may be of n-type or p-type and, when a p-type MOS transistor is used, the low-potential power supply line and the high-potential power supply line may be exchanged opposite to the case of an n-type MOS transistor.

According to an embodiment, while sufficient recording of information is performed, an influence of destruction on information memory devices of a nonvolatile memory accompanied by resistance changes is reduced and long-life and improvement in reliability can be realized.

Additional features and advantages are described herein, and will be apparent from the following Detailed Description and the figures.

DETAILED DESCRIPTION

The present application will be explained with reference to the accompanying drawings. The explanation will be made in the order of the following items.

Overview of Nonvolatile Memory Using Spin MRAM

1. First Embodiment (Recording circuit: example of supplying drive voltage using two bit lines)

2. Second Embodiment (Recording circuit: example of supplying drive voltage using only one bit line)

3. Third Embodiment (Recording circuit: example of providing constant-voltage circuit and constant-current circuit on word line)

4. Fourth Embodiment (Recording circuit: example of providing constant-voltage circuit and constant-current circuit on bit line)

5. Others (measurement data)

Overview of Nonvolatile Memory Using Spin MRAM>
Example of Writing Control

Figure 1:
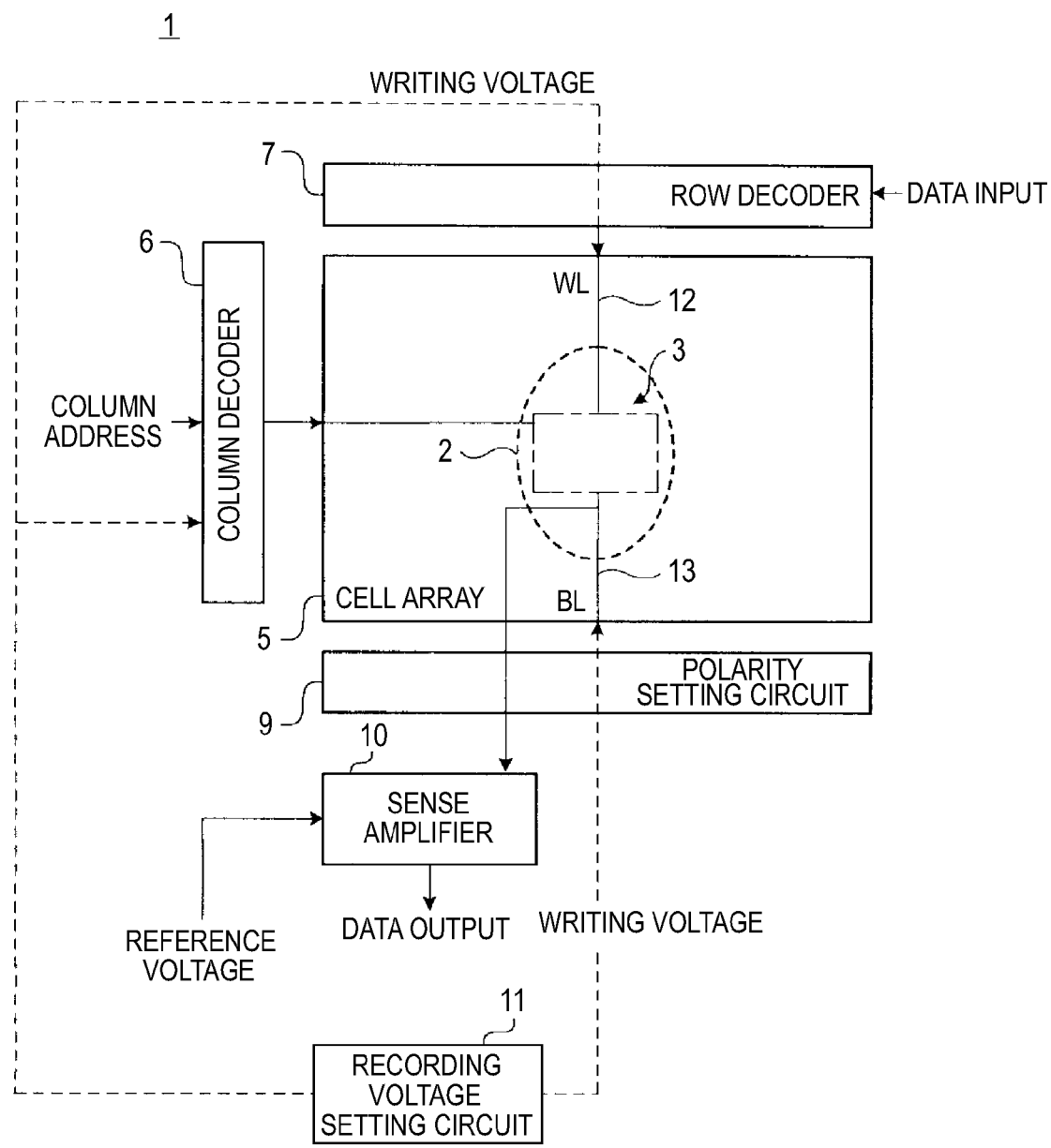
FIG. 1 is a functional block diagram showing an internal configuration of a spin MRAM.
Figure 2:
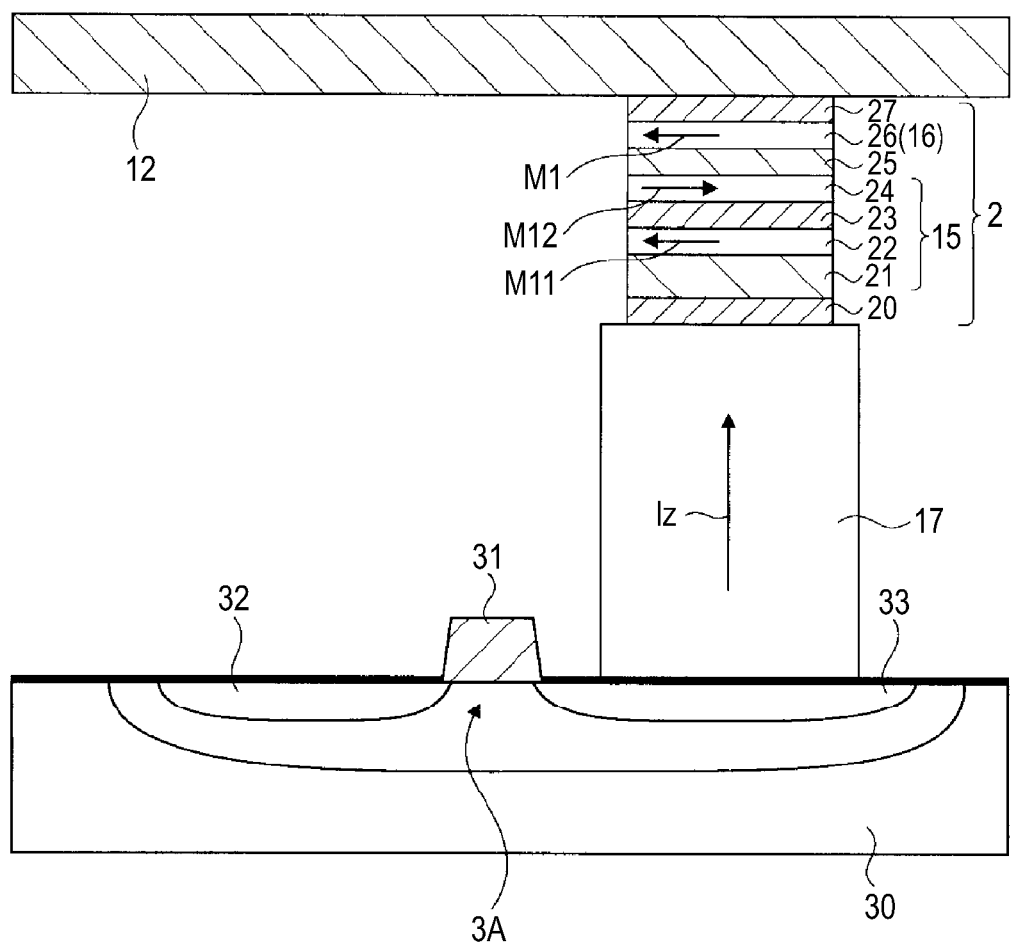
FIG. 2 is a schematic sectional view of a main part of a memory cell of a nonvolatile memory using spin transfer.

An overview of a nonvolatile memory to which the application is applied will be explained with reference to FIGS. 1 and 2. Here, an example of applying a nonvolatile memory of an embodiment of the application to a spin MRAM is shown. FIGS. 1 and 2 only show the schematic entire configuration for explanation of the overview of the spin MRAM, and, for details, refer to the explanation of the first to fourth embodiments, which will be described later.

FIG. 1 is a functional block diagram showing an internal configuration of a spin MRAM 1. Except the internal configuration of a selection circuit 3, the other part has a generally known configuration.

Information memory devices 2 that hold information are arranged in an array to form a cell array 5. The respective information memory devices 2 are connected to a bit line (BL) 13 vertically extending on the cell array 5 through the selection circuit 3. Further, the selection circuit 3 is connected to a word line (WL) 12 horizontally extending on the cell array 5 (in the drawing, vertically depicted for convenience). The selection circuit 3 is formed using switching elements such as MOS transistors, resistance elements, etc. and its details will be described later as the first to fourth embodiments. Note that, in this specification, attention is focused on a recording operation, and the selection circuit is also referred to as a recording circuit.

A fundamental relation between the selection circuit 3 and respective decoders will be explained. The gate terminals of the respective switching elements within the selection circuit 3 are connected to a column decoder 6 provided on the left of the cell array 5 and their right ends are opened. Further, the upper and lower ends of the respective word line and bit line are connected to a row decoder 7 and a polarity setting circuit 9 provided on and under the cell array 5, respectively. Note that the forms of these wirings may be partially different with respect to each embodiment, please refer to the explanation of the respective embodiments for their details.

The example of FIG. 1 has a one-row and one-column configuration. For example, in the case of 512-row and 512-column configuration, an address is 18 bits, and the higher 9 bits are assigned to a row address and the lower 9 bits are assigned to a column address. The row address is input to the row decoder 7 and the column address is input to the column decoder 6.

A recording voltage (writing voltage) supplied to the selection circuit 3 (recording circuit) is controlled by a recording voltage setting circuit 11 through the column decoder 6, the row decoder 7, or the polarity setting circuit 9.

The polarity setting circuit 9 changes polarity of a spin injection current flown in the information memory device 2 of the spin MRAM 1. By changing the polarity of the spin injection current, the spin injection current flowing in the information memory device 2 can be changed in a direction from a MOS transistor 3A toward the word line 12 or a direction from the word line 12 to the MOS transistor 3A. Thereby, the potential of the word line is switched to a high potential or a low potential.

Further, the spin MRAM 1 includes a sense amplifier 10 connected to the bit line, to which a sense voltage necessary for flowing the current read out from the information memory device 2 is input. A reference voltage having a predetermined magnitude is input to the sense amplifier 10, and the sense amplifier 10 reads out the information written in the information memory device 2 by comparing the sense voltage and the reference voltage.

Next, a general internal configuration example of the memory cell of the spin MRAM 1 using spin transfer will be explained.

FIG. 2 is a schematic sectional view of a main part of the information memory device 2 (hereinafter, may be referred to as "memory cell" for convenience of explanation).

In order to electrically select a memory cell for reading information stored in the memory cell, a diode, a MOS transistor, or the like may be used. The memory cell shown in FIG. 2 uses a MOS transistor. Note that FIG. 2 is mainly intended for explanation of the configuration of the information memory device 2, and shows an example provided with one MOS transistor as a driving transistor of the memory cell (corresponding to FIGS. 9 and 10). In the embodiments described as below, there is a configuration having two MOS transistors connected in series.

First, a configuration example of the memory cell will be explained.

A ferromagnetic layer 22 and a ferromagnetic layer 24 are provided via a nonmagnetic layer 23 and antiferromagnetically-coupled. Further, the lower ferromagnetic layer 22 is provided in contact with an antiferromagnetic layer 21 and has unidirectional strong magnetic anisotropy by the exchange interaction acting between these layers. These layers 21, 22, 23, 24 form a magnetization fixed layer 15. That is, the magnetization fixed layer 15 has the two ferromagnetic layers 22, 24.

A ferromagnetic layer 26 provided upper than the magnetization fixed layer 15 is formed so that the direction of the magnetization M1 may relatively easily rotate, and the ferromagnetic layer 26 forms a memory layer (magnetization free layer) 16.

A tunnel insulating layer 25 (tunnel barrier layer) is formed between the ferromagnetic layer 24 and the ferromagnetic layer 26 of the magnetization fixed layer 15, i.e., between the magnetization fixed layer 15 and the memory layer 16. The tunnel insulating layer 25 serves to cut the magnetic coupling of the upper and lower ferromagnetic layers 26 and 24 and flow a tunnel current. Thereby, the magnetization fixed layer 15 in which directions of magnetization of the respective magnetic layers are fixed, the tunnel insulating layer 25, and the memory layer 16 in which the magnetization direction can be changed form a TMR (tunnel magnetic resistance effect) element.

Further, the above described respective layers 21 to 26, a foundation film 20, and a topcoat layer 27 form the information memory device 2 having a function as the TMR element.

As an example, materials of the respective layers forming the information memory device 2 are as follows.

As a material of the antiferromagnetic layer 21, for example, PtMn may be used.

As a material of the ferromagnetic layers 22, 24 of the magnetization fixed layer 15, a ferromagnetic material such as CoFe may be used.

As a material of the nonmagnetic layer 23, for example, Ru, Ta, Cr, Cu may be used.

As a material of the tunnel insulating layer 25, for example, MgO may be used.

As a material of the ferromagnetic layer 26 as the memory layer 16, a ferromagnetic material such as CoFeB may be used.

In a silicon substrate 30, the MOS transistor 3A as one component element of the selection circuit 3 is formed, and a connection plug 17 is formed on one diffusion layer 33 of the MOS transistor 3A. Onto the connection plug 17, the foundation film 20 of the information memory device 2 is connected. The other diffusion layer 32 of the MOS transistor 3A is connected to the bit line (BL), for example, via a connection plug (not shown). A gate 31 of the MOS transistor 3A is connected to the column decoder 6. The topcoat layer 27 of the information memory device 2 is connected to the word line 12 thereon.

In the steady state, magnetization M11 of the ferromagnetic layer 22 and magnetization M12 of the ferromagnetic layer 24 are nearly in the complete antiparallel condition because of the strong antiferromagnetic coupling via the nonmagnetic layer 23.

Typically, the ferromagnetic layer 22 and the ferromagnetic layer 24 have configurations with equal thickness products of saturated magnetization films, and the leakage component of the magnetic pole field is negligibly small.

Further, the resistance value of the TMR element containing these layers 24, 25, 26 changes depending on whether the direction of magnetization M1 of the ferromagnetic layer 26 of the memory layer 16 and the direction of magnetization M12 of the ferromagnetic layer 24 of the magnetization fixed layer 15 are in the parallel state or antiparallel state. In the parallel state of the two magnetizations M1, M12, the resistance value is low, and, in the antiparallel state, the resistance value is high. When the resistance value of the TMR element changes, the resistance value of the entire information memory device 2 also changes. Using the phenomenon, information can be stored and stored information can be read out. For example, by assigning the state with the low resistance value to "0" information and assigning the state with the high resistance value to "1" information, binary (one-bit) information can be stored.

Note that the ferromagnetic layer 24 at the memory layer 16 side of the magnetization fixed layer 15 is a ferromagnetic layer to be referred to as a criterion of the direction of the magnetization M1 of the memory layer 16 when the stored information is read out, and is also referred to as "reference layer".

To rewrite the information in the memory cell and read out the information written in the memory cell, it is necessary to flow a spin injection current Iz. The spin injection current Iz passes through the diffusion layer 33, the information memory device 2, and the word line 12.

On the other hand, by changing the polarity of the spin injection current Iz, the spin injection current Iz flowing in the information memory device 2 can be changed in a direction from the MOS transistor 3A toward the word line 12, or a direction from the word line 12 toward the MOS transistor 3A.

Thereby, the information in the memory cell can be rewritten by changing the direction of the magnetization M1 of the memory layer 16 of the information memory device 2.

Next, an example of a writing operation of information in the TMR element 2 will be explained.

The column decoder 6 sets the voltage of the gate electrode of the switching element selected in response to the column address to the power supply voltage and turns on the selection circuit 3.

The row decoder 7 electrically connects the word line 12 selected in response to the row address to the selection circuit 3.

The row decoder 7 outputs a recording voltage when the data input is "1", and outputs a ground voltage when the data input is "0". Conversely, the polarity setting circuit 9 outputs a recording voltage when the data input of the row decoder 7 is "0", and outputs a ground voltage when the data input is "1". In this manner, the direction of the current changes depending on the data input, and thereby, a writing operation of information of "0" or "1" can be performed on the selected information memory device 2.

Next, an example of a readout operation of information from the TMR element 2 will be explained.

The selection of the word line 12 is the same as that at writing of information. The row decoder 7 electrically connects the word line 12 selected in response to the row address to the selection circuit 3. Further, the row decoder electrically connects the bit line 13 to the sense amplifier 12 in response to the row address. In this manner, a constant readout current is flown from the sense amplifier 10 to the selected information memory device 2.

It is assumed that, when the state of the information memory device 2 is "1", i.e., in the high-resistance state, a sense voltage necessary for flowing a readout current is V1. Similarly, it is assumed that, when the state of the information memory device 2 is "0", i.e., in the low-resistance state, a sense voltage necessary for flowing a readout current is V0. From the magnitude relation between the resistance values, V1>V0. Accordingly, a reference voltage smaller than V1 and larger than V0 is input to the sense amplifier 10.

The sense amplifier 10 compares the sense voltage and the reference voltage. Here, the information memory device 2 may be determined in the "1-state" when "sense voltage>reference voltage", and information memory device 2 may be determined in the "0-state" when "sense voltage<reference voltage". That is, the readout operation of information can be performed.

Example of Recording Voltage Setting Circuit

Figure 4:
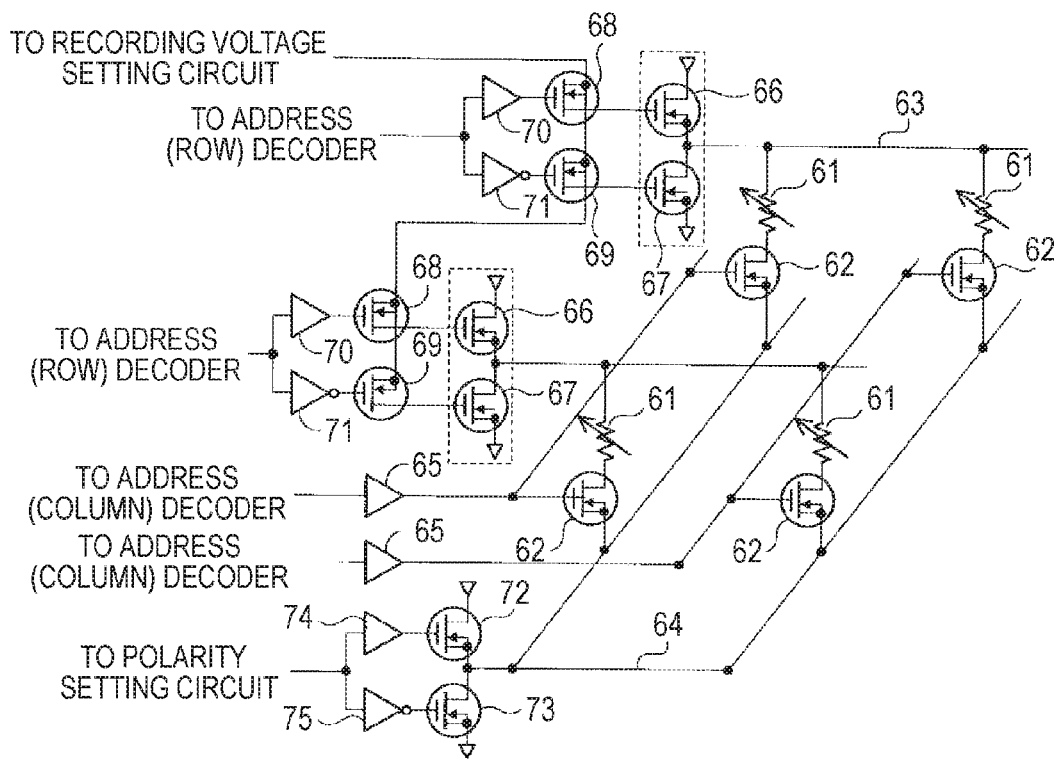
FIG. 4 shows a recording circuit example (2) including peripheral circuits for setting a recording voltage.
Figure 5:
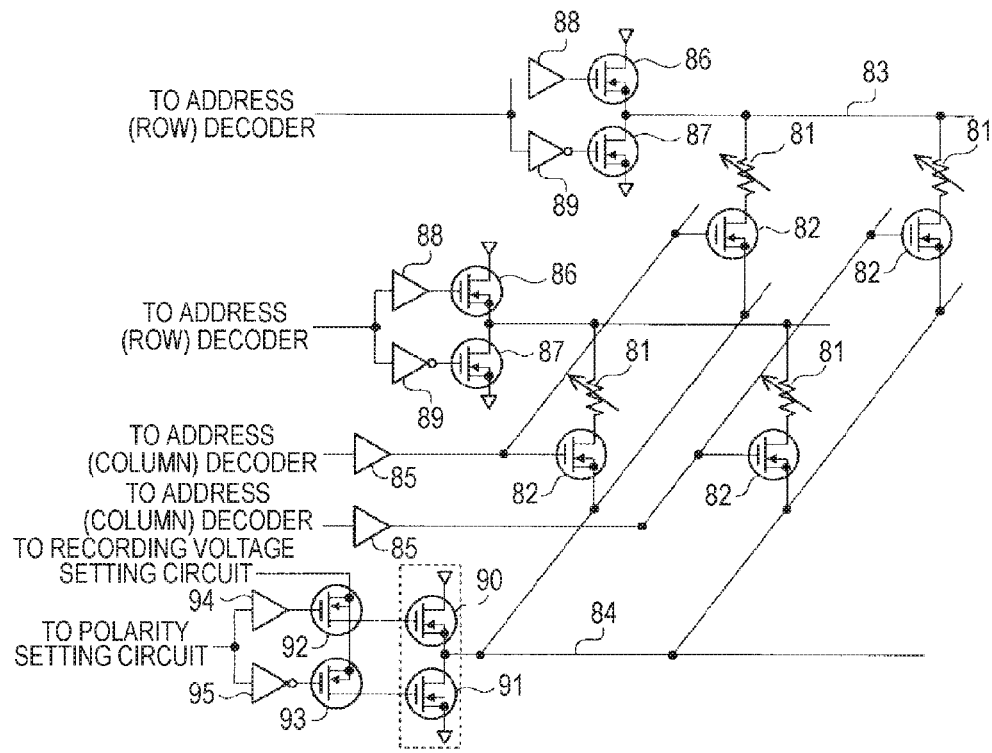
FIG. 5 shows a recording circuit example (3) including peripheral circuits for setting a recording voltage.

Here, as methods of setting a recording voltage, representative three setting methods will be explained. As below, circuit examples for realization of the respective setting methods are shown in FIGS. 3 to 5.

Figure 3:
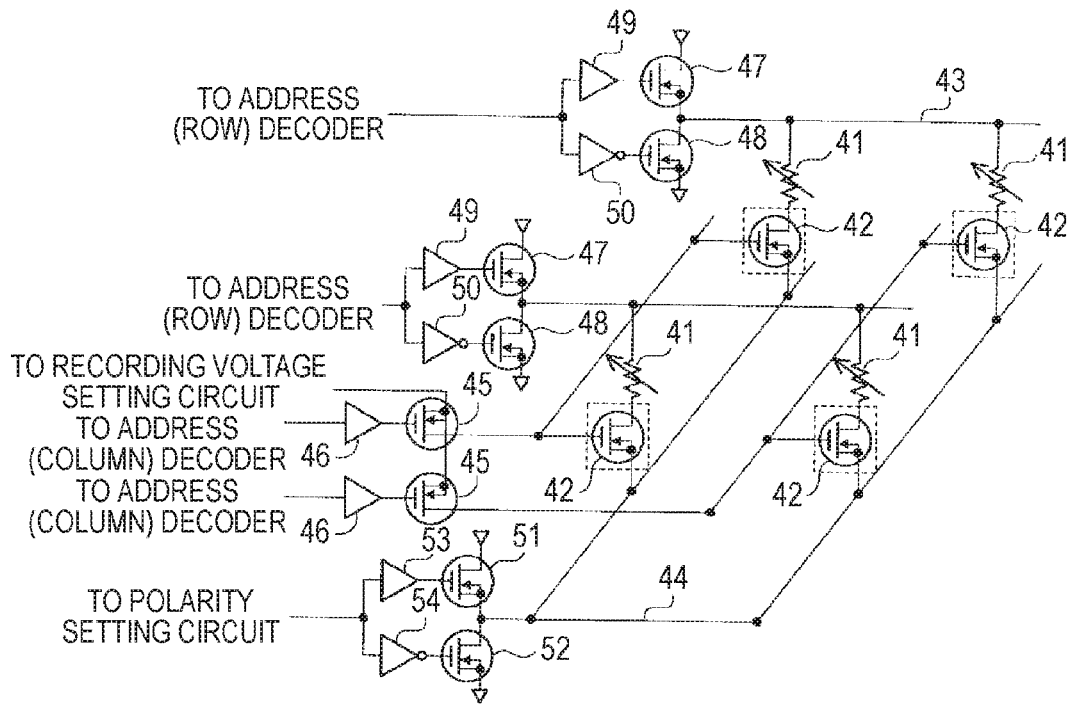
FIG. 3 shows a recording circuit example (1) including peripheral circuits for setting a recording voltage.

FIG. 3 shows a circuit example for realizing a method of controlling the gate voltage of MOS transistors for driving (dotted line parts) directly connected to information memory devices.

In this example, plural information memory devices 41 (corresponding to the information memory devices 2) are connected to a word line 43 as one of address lines (here, called a word line) in correspondence with the arrangement of memory cells. In the drawing, four information memory devices 41 are shown, however, as a representative, one information memory device 41 and peripheral circuits will be explained.

In FIG. 3, the word line 43 is connected to one end of the information memory device 41. The word line 43 is connected to the midpoint of connection between series-connected n-type MOS transistors 47, 48. A buffer circuit 49 that functions as a buffer for timing the signal input to the recording circuit is connected to the gate electrode of the n-type MOS transistor 47, and a NOT circuit (logical negation circuit) 50 is connected to the gate electrode of the n-type MOS transistor 48. A signal from the row decoder 7 is input to the buffer circuit 49 and the NOT circuit 50.

An N-type MOS transistor 42 for selection is connected between the other end of the information memory device 41 and a bit line 44 as one of one address lines (here, called a bit line). The gate electrode of the n-type MOS transistor 42 provided on the same bit line is connected to the source electrode of the same n-type MOS transistor 45. A signal from the recording voltage setting circuit 11 is input to the drain electrode of the n-type MOS transistor 45, and a signal from the column decoder 6 is input to the gate electrode via a buffer circuit 46.

The bit line 44 is connected to the midpoint of connection between series-connected n-type MOS transistors 51, 52. A buffer circuit 53 is connected to the gate electrode of the n-type MOS transistor 51, a NOT circuit 54 is connected to the gate electrode of the n-type MOS transistor 52, and a signal from the polarity setting circuit 9 is input to the buffer circuit 53 and the NOT circuit 54.

FIG. 4 shows a circuit example for realizing a method of setting a voltage of the word line by MOS transistors for driving shown by dotted lines.

In the drawing, four information memory devices 61 are shown, however, as a representative, one information memory device 61 and peripheral circuits will be explained.

In FIG. 4, a word line 63 is connected to one end of the information memory device 61. The word line 63 is connected to the midpoint of connection between series-connected n-type MOS transistors 66, 67. The gate electrodes of the n-type MOS transistors 66, 67 are connected to the source electrodes of n-type MOS transistors 68, 69, respectively. The drain electrodes of the n-type MOS transistor 68 and the n-type MOS transistor 69 provided with respect to each word line 63 are connected, and a signal from the recording voltage setting circuit 11 is input thereto. Further, a buffer circuit 70 is connected to the gate electrode of the n-type MOS transistor 68, a NOT circuit 71 is connected to the gate electrode of the n-type MOS transistor 69, and a signal from the row decoder 7 is input to the buffer circuit 70 and the NOT circuit 71.

An N-type MOS transistor 62 for selection is connected between the other end of the information memory device 61 and a bit line 64 as one of one address lines (here, called a bit line). A signal from the column decoder 6 is input to the gate electrode of the n-type MOS transistors 62 provided on the same bit line 64 via the same buffer circuit 65.

The bit line 64 is connected to the midpoint of connection between series-connected n-type MOS transistors 72, 73. A buffer circuit 74 is connected to the gate electrode of the n-type MOS transistor 72, a NOT circuit 75 is connected to the gate electrode of the n-type MOS transistor 73, and a signal from the polarity setting circuit 9 is input to the buffer circuit 74 and the NOT circuit 75.

FIG. 5 shows a circuit example for realizing a method of setting a voltage of the bit line by MOS transistors for driving shown by a dotted line.

In the drawing, four information memory devices 81 are shown, however, as a representative, one information memory device 81 and peripheral circuits will be explained.

In FIG. 5, a word line 83 is connected to one end of the information memory device 81. The word line 83 is connected to the midpoint of connection between series-connected n-type MOS transistors 86, 87. A buffer circuit 88 is connected to the gate electrode of the n-type MOS transistor 86, a NOT circuit 89 is connected to the gate electrode of the n-type MOS transistor 87, and a signal from the row decoder 7 is input to the buffer circuit 88 and the NOT circuit 89.

An n-type MOS transistor 82 for selection is connected between the other end of the information memory device 81 and a bit line 84 as one of one address lines (here, called a bit line). A signal from the column decoder 6 is input to the gate electrode of the n-type MOS transistor 82 provided on the same bit line 84 via the same buffer circuit 85.

The bit line 84 is connected to the midpoint of connection between series-connected n-type MOS transistors 90, 91. The gate electrodes of the n-type MOS transistors 90, 91 are connected to the source electrodes of n-type MOS transistors 92, 93, respectively. The drain electrodes of the n-type MOS transistor 92 and the n-type MOS transistor 93 provided with respect to each bit line 84 are connected, and a signal from the recording voltage setting circuit 11 is input thereto. Further, a buffer circuit 94 is connected to the gate electrode of the n-type MOS transistor 92, a NOT circuit 95 is connected to the gate electrode of the n-type MOS transistor 93, and a signal from the polarity setting circuit 9 is input to the buffer circuit 94 and the NOT circuit 95.

The above described examples of FIGS. 3 to 5 are circuits in which both polarities switched by the polarity setting circuit 9 are recorded by voltages. Here, a recording method of the circuit configuration in FIG. 3 will be explained.

In FIG. 3, the voltage applied to the source electrode (or the drain electrode) of the n-type MOS transistor 42 for driving the information memory device 2 is set to the low-voltage level or the high-voltage level by the polarity setting circuit 9. Then, the voltage of the electrode of the word line 43 connected to the information memory device 41 to be recorded is determined according to the data of the row decoder 7, and the voltage supplied from the recording voltage setting circuit 11 to the gate electrode of the n-type MOS transistor 42 connected to the information memory device 41 to be recorded is supplied according to the information from the column decoder 6. In this manner, a current can be flown only in the target information memory device 41.

The same operation is performed in the circuits of FIGS. 4 and 5, however, where to set the voltages applied to the information memory devices 61, 81 is different. In the circuits of FIGS. 4 and 5, the voltages are set at the word line 63 side and the bit line 84 side, respectively.

In the circuits shown in FIGS. 3 to 5, since driving transistors for polarity switching are used, voltage drops occur due to the driving transistors for polarity switching. Thus, the voltage applied to the information memory device is limited. Accordingly, in the following first embodiment as below, a circuit that can apply a larger voltage to an information memory device will be proposed.

1. First Embodiment
Configuration of Recording Circuit

Figure 6:
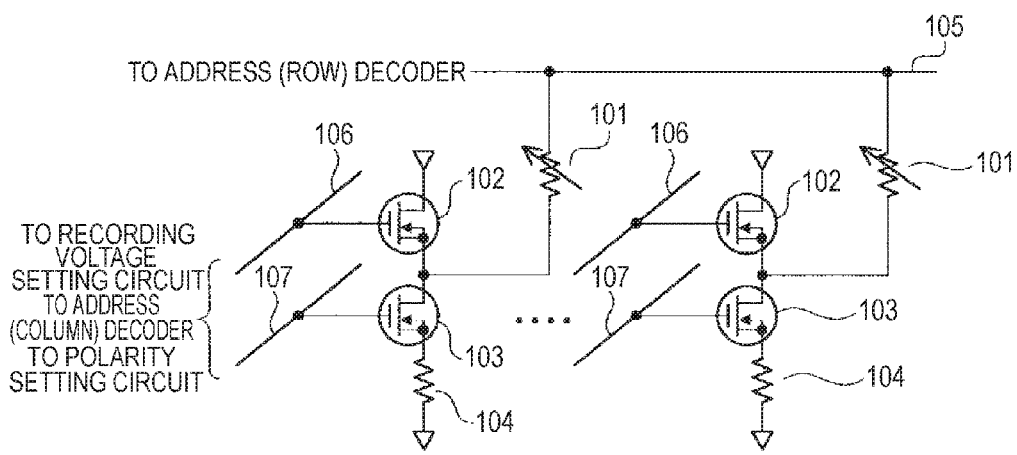
FIG. 6 shows a schematic configuration example of a recording circuit according to a first embodiment.

Referring to FIG. 6, a configuration example of a recording circuit (the selection circuit 3 in FIG. 1) of a nonvolatile memory according to the first embodiment is shown. The embodiment has a configuration in which driving transistors connected to information memory devices are connected to a high-voltage potential and a low-voltage potential directly or through resistance elements, which is completely different from those of the circuits in FIGS. 3 to 5.

Note that, in the example of FIG. 6, plural information memory devices 101 (corresponding to the information memory devices 2) are connected to a word line 105 as one of address lines (here, called a word line) in correspondence with the arrangement of memory cells. In the drawing, two information memory devices 101 are shown, however, as a representative, one information memory device 101 and peripheral circuits will be explained.

The word line 105 is connected to one end of the information memory device 101, and the word line 105 is switched between a low potential and a high potential by the polarity setting circuit 9. The other end of the information memory device 101 is connected to the midpoint of connection between the source electrode of an n-type MOS transistor 102 and the drain electrode of an n-type MOS transistor 103. The n-type MOS transistor 102 is for turning the potential of the one end of the connected information memory device 101 to the high potential, and the n-type MOS transistor 103 is for turning the potential of the one end of the information memory device 101 to the low potential. The drain electrode of each n-type MOS transistor 102 is connected to the high-potential side of the power supply and the source electrode of each n-type MOS transistor 103 is connected to the low-potential side of the power supply via a resistance element 104. The n-type MOS transistor 102 and the n-type MOS transistor 103 are controlled by voltages applied to bit lines 106, 107 as ones of address lines (here, called bit lines) connected to the gate electrodes, respectively. The n-type MOS transistors 102, 103 are provided in correspondence with each information memory device 101 forming the nonvolatile memory.

Figure 7:
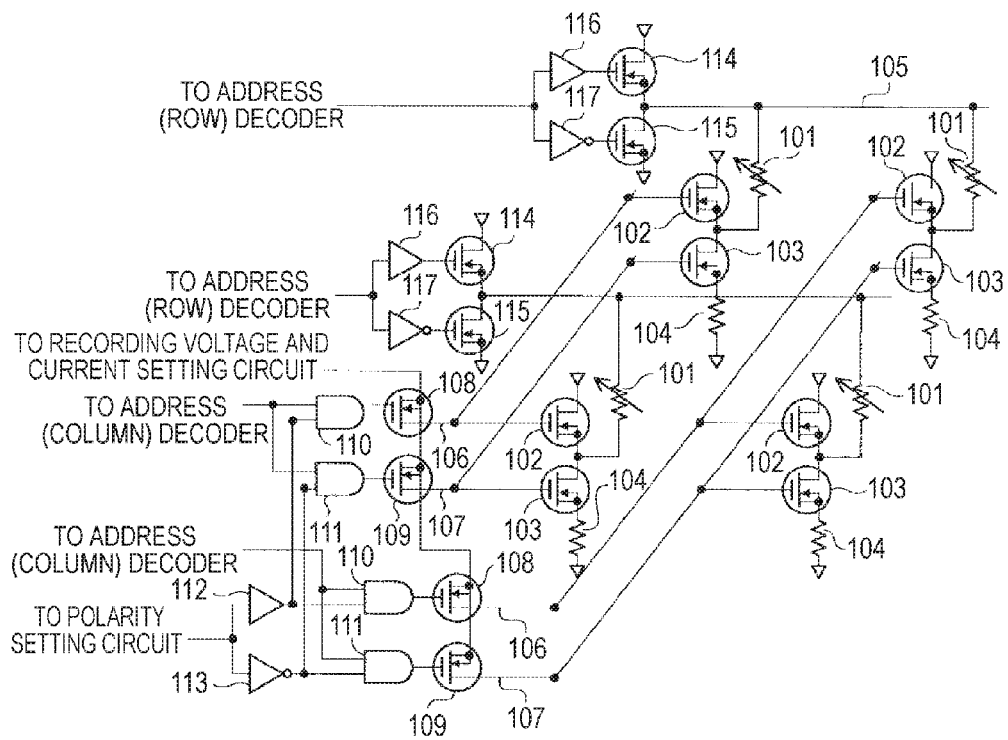
FIG. 7 is a diagram of the recording circuit in FIG. 6 including peripheral circuits.

FIG. 7 shows the recording circuit in FIG. 6 including peripheral circuits. In FIG. 7, the same signs are assigned to the parts corresponding to those in FIG. 6 and the detailed explanation will be omitted.

In FIG. 7, the word line 105 connected to the one end of the information memory device 101 is connected to the midpoint of connection between series-connected n-type MOS transistors 114, 115. A buffer circuit 116 is connected to the gate electrode of the n-type MOS transistor 114, a NOT circuit 117 is connected to the gate electrode of the n-type MOS transistor 115, and a signal from the row decoder 7 is input to the buffer circuit 116 and the NOT circuit 117.

Further, the bit lines 106, 107 are connected to the source electrodes of n-type MOS transistors 108, 109, respectively. The drain electrodes of the n-type MOS transistor 108 and the n-type MOS transistor 109 are connected and a signal from a recording voltage and current setting circuit (corresponding to the recording voltage setting circuit 11) is input thereto. Further, a logical product circuit 110 is connected to the gate electrode of the n-type MOS transistor 108, a logical product circuit 111 is connected to the gate electrode of the n-type MOS transistor 109, and a signal from the row decoder 7 is input to the buffer circuit 116 and the NOT circuit 117.

A signal from the column decoder 6 is input to one input terminal of the logical product circuit 110, and a signal from the polarity setting circuit 9 is input to the other input terminal via a buffer circuit 112. Further, a signal from the column decoder 6 is input to one input terminal of the logical product circuit 111, and a signal from the polarity setting circuit 9 is input to the other input terminal via a NOT circuit 113.

In the circuit configuration, when the bit line 106 is at the high potential and the bit line 107 is at the low potential, and the word line 105 is at the low potential, a current flows in the information memory device 101 from bottom to top (in the direction toward the word line 105). In this regard, the n-type MOS transistor 102 performs a source follower operation, and the voltage applied to the information memory device 101 is near a constant voltage and the voltage applied to the information memory device 101 can be controlled by the voltage of the bit line 106.

Conversely, when it is desired that a current is flown in the information memory device 101 from top to bottom (in the direction toward the midpoint of connection between the n-type MOS transistors 102, 103), the bit line 106 may be set to the low potential and the bit line 107 may be set to the high potential, and the word line 105 may be set to the high potential. In this regard, by connecting an appropriate resistance element 104 between the n-type MOS transistor 103 and the low-potential side of the power supply, an operation with a nearly constant voltage that can control the current flowing in the information memory device 101 by the voltage of the bit line 107 may be performed. Note that, in place of the resistance element 104, the source electrode and the drain electrode of the n-type MOS transistor 103 may be connected and the gate electrode may be used at an appropriate potential.

According to the nonvolatile memory and the recording method thereof of the above explained embodiment, constant-current recording is performed when information in the low-resistance state is recorded, and constant-voltage recording is performed when information in the high-resistance state is recorded. That is, as shown in FIG. 3, when information in the high-resistance state is recorded, the n-type MOS transistor 102 performs a constant-voltage operation and, when information in the low-resistance state is recorded, the n-type MOS transistor 103 performs a constant-current operation.

Further, in the embodiment, when the information to be recorded is determined depending on the positive or negative polarity of the recording voltage, recording is performed on one polarity by current control and on the other polarity by voltage control.

According to the above described configuration, the driving transistors connected to the information memory device are the two n-type MOS transistors 102, 103. Accordingly, compared to the circuits in FIGS. 3 to 5, the larger number of driving transistors is necessary. However, in the configuration, the driving transistors for polarity switching are not used, but the driving transistors connected to the information memory devices can be connected to the high-voltage potential and the low-voltage potential directly or through the resistance elements. Thus, there is no voltage drop due to the driving transistors for polarity switching and larger voltages can be applied to the information memory devices.

Note that, when p-type MOS transistors are used in place of n-type MOS transistors, the low-potential power supply and the high-potential power supply may be exchanged opposite to the case of the n-type MOS transistors.

2. Second Embodiment

Figure 8:
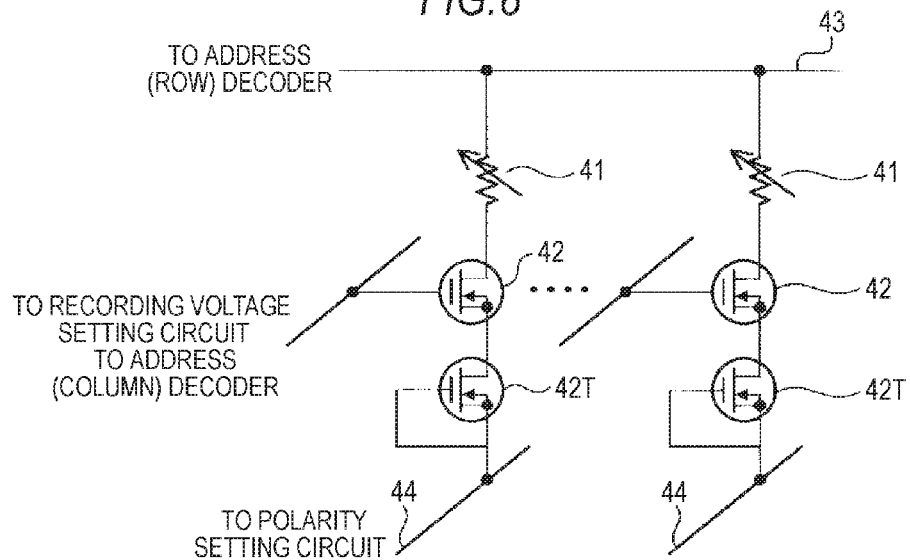
FIG. 8 shows a schematic configuration example of a recording circuit according to a second embodiment.

Next, referring to FIG. 8, a configuration example of a recording circuit (the selection circuit 3 in FIG. 1) of a nonvolatile memory according to the second embodiment is shown.

The embodiment is different from the first embodiment and is an example in which the number of bit lines is reduced to one. That is, the embodiment is an example of realizing current driving by adding another driving transistor to the driving transistor connected to the information memory device shown in FIG. 3. Note that, in the example of FIG. 8, plural information memory devices 41 (corresponding to the information memory devices 2) are connected to a word line 43 as one of address lines in correspondence with the arrangement of memory cells. In the drawing, two information memory devices 41 are shown, however, as a representative, one information memory device 41 will be explained.

The word line 43 is connected to one end of the information memory device 41, and the word line 43 is switched between a low potential and a high potential by the polarity setting circuit 9. A series circuit of an n-type MOS transistor 42 for selection and an n-type MOS transistor 42T for current control is connected between the other end of the information memory device 41 and a bit line 44 as one of one address lines. The gate electrode and the source electrode of each n-type MOS transistor 42T are connected, and the source electrode is connected to the bit line 44. The n-type MOS transistor 42 is controlled by the voltage applied from the recording voltage setting circuit 11 to one of the address lines connected to the gate electrode 56.

When the gate electrode of the n-type MOS transistor 42 is at the high potential, in the case where the word line 43 is at the high potential and the bit line 44 is at the low potential, a current flows in the information memory device 41 from top to bottom (in the direction toward the n-type MOS transistor 42). Conversely, in the case where the word line 43 is at the low potential and the bit line 44 is at the high potential, a current flows from bottom to top (in the direction toward the word line 43).

In the n-type MOS transistor 42T, in the case where the bit line 44 is at the high potential, the current flowing in the n-type MOS transistor 42T is not limited, and it operates with a nearly constant voltage. On the other hand, in the case where the bit line 44 is at the low potential, the current is limited in the n-type MOS transistor 42T, and it operates with a nearly constant current. That is, when a current is flown in the information memory device 41 from bottom to top, a constant-voltage operation is performed and, when a current is flown from top to bottom, a constant-current operation is performed. Note that, if the connection destination of the gate electrode of the n-type MOS transistor 42T for current limitation is changed from the bit line 44 to the source electrode of the n-type MOS transistor 42 for selection, the constant-current and constant-voltage operations are reversed.

In the embodiment, when information in the high-resistance state is recorded, the n-type MOS transistor 42T performs a constant-voltage operation and, when information in the low-resistance state is recorded, the n-type MOS transistor 42T performs a constant-current operation. Since only one bit line is necessary, the circuit configuration can be simplified. In this case, the n-type MOS transistors 42, 42T in the two-stage connection operate at recording, and accordingly, the current supplied to the information memory device 41 decreases.

Further, the power supply of the two n-type MOS transistors 42, 42T and the power supply of the voltage applied to the information memory device 41 are common, the voltage applied to the information memory device 41 is lower than the power supply voltage. Thus, the voltage applied to the information memory device 41 is kept low.

Note that, when p-type MOS transistors are used in place of the n-type MOS transistors, the low-potential power supply and the high-potential power supply may be exchanged opposite to the case of the n-type MOS transistors.

3. Third Embodiment

Figure 9:
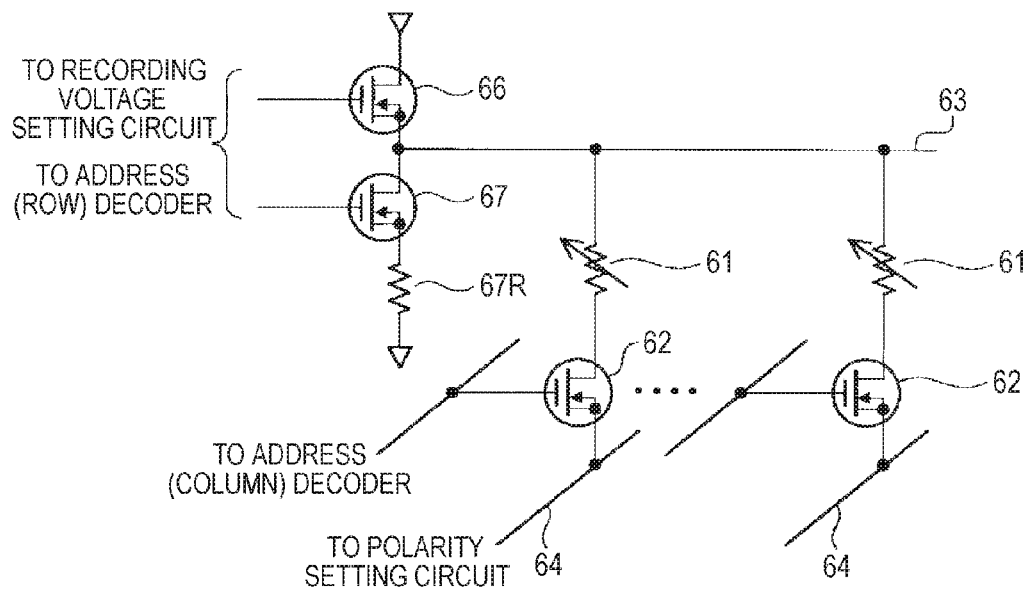
FIG. 9 shows a schematic configuration example of a recording circuit according to a third embodiment.

Next, referring to FIG. 9, a configuration example of a recording circuit (the selection circuit 3 in FIG. 1) of a nonvolatile memory according to the third embodiment is shown.

The embodiment is different from the first embodiment and the second embodiment, and is an example in which a control circuit for constant current and constant voltage is provided at the word line side, not with respect to each information memory device. That is, the embodiment is an example of realizing current driving by adding a driving transistor to the word line connected to the information memory device in FIG. 4. In the example of FIG. 9, an n-type MOS transistor 66 for constant voltage and an n-type MOS transistor 67 for constant current are connected to a word line 63. Note that plural information memory devices 61 (corresponding to the information memory devices 2) are connected to the word line 63 as one of address lines in correspondence with the arrangement of memory cells. In the drawing, two information memory devices 61 are shown, however, as a representative, one information memory device 61 will be explained.

The word line 63 is connected to one end of the information memory device 61, and the word line 63 is switched between a low potential and a high potential by the polarity setting circuit 9. An n-type MOS transistor 62 for selection is connected between the other end of the information memory device 61 and a bit line 64 as one of one address lines. The n-type MOS transistor 62 is controlled by the voltage applied from the recording voltage setting circuit 11 to one of the address lines connected to the gate electrode. Further, the word line 63 is connected to the midpoint of connection between the source electrode of the n-type MOS transistor 66 and the drain electrode of the n-type MOS transistor 67. The drain electrode of the n-type MOS transistor 66 is connected to the high-potential side of the power supply and the source electrode of the n-type MOS transistor 67 is connected to the low-potential side of the power supply via a resistance element 67R.

When a high-potential voltage is applied to the gate electrode of the n-type MOS transistor 66 and a low-potential voltage is applied to the gate electrode of the n-type MOS transistor 67, the word line 63 connected to the midpoint of connection between the n-type MOS transistors 66, 67 and the information memory device 61 is at the high potential. In this state, when the gate electrode of the n-type MOS transistor 62 for selection is at the high potential and the bit line 64 is at the low potential, a current flows in the information memory device 61 from top to bottom (in the direction toward the n-type MOS transistor 62). In this regard, the n-type MOS transistor 66 performs a source follower operation, and the voltage applied to the information memory device 61 is near a constant voltage. The voltage applied to the information memory device 61 can be controlled by the voltage applied to the gate electrodes of the n-type MOS transistors 66, 67.

Conversely, when the gate electrode of the n-type MOS transistor 66 is at the low potential, the gate electrode of the n-type MOS transistor 67 is at the high potential, and the bit line 64 is at the high potential, a current flows in the information memory device 61 from bottom to top (in the direction toward the word line 63). In this regard, by connecting the appropriate resistance element 67R between the n-type MOS transistor 67 and the low-potential side of the power supply, and an operation with a nearly constant current that can control the current flowing in the information memory device 61 by the potential of the gate electrode of the n-type MOS transistor 67 may be performed.

In the embodiment, the n-type MOS transistor 66 performs the constant-voltage operation when information in the high-resistance state is recorded, and the n-type MOS transistor 67 performs the constant-current operation when information in the low-resistance state is recorded. Further, in the configuration, one control circuit for constant current and constant voltage is connected to one word line, not with respect to each information memory device, the number of MOS transistors can be reduced compared to the first and second embodiments and the circuit size can be kept small.

Note that, when p-type MOS transistors are used in place of the n-type MOS transistors, the low-potential power supply and the high-potential power supply may be exchanged opposite to the case of the n-type MOS transistors.

4. Fourth Embodiment

Figure 10:
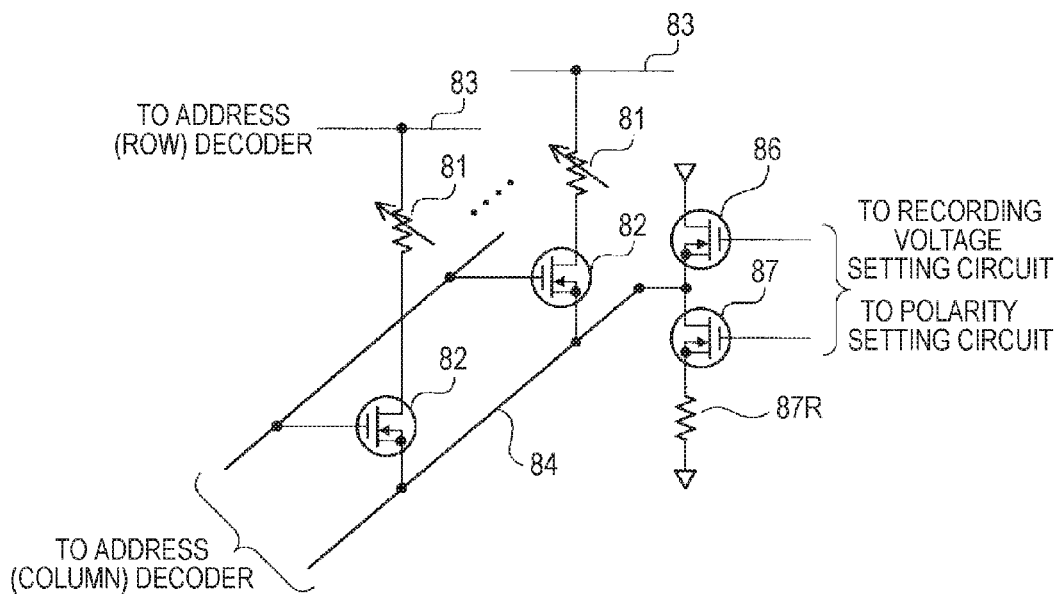
FIG. 10 shows a schematic configuration example of a recording circuit according to a fourth embodiment.

Next, referring to FIG. 10, a configuration example of a recording circuit (the selection circuit 3 in FIG. 1) of a non-volatile memory according to the fourth embodiment is shown.

The embodiment is an example in which a control circuit for constant current and constant voltage is provided at the bit line side, not with respect to each information memory device. That is, the embodiment is an example of realizing current driving by adding a driving transistor to the bit line connected to the information memory device in FIG. 5. In the example of FIG. 10, an n-type MOS transistor 86 for constant voltage and an n-type MOS transistor 87 for constant current are connected to a bit line 84. Note that, plural information memory devices 81 (corresponding to the information memory devices 2) are connected to a word line 83 as one of address lines in correspondence with the arrangement of memory cells. In the drawing, two information memory devices 81 are shown, however, as a representative, one information memory device 81 will be explained.

The word line 83 is connected to one end of the information memory device 81, and the word line 83 is switched between a low potential and a high potential by a driving voltage supplied from the polarity setting circuit 9 to n-type MOS transistors 86, 87. An n-type MOS transistor 82 for selection is connected between the other end of the information memory device 81 and the bit line 84 as one of one address lines. The n-type MOS transistor 82 is controlled by the voltage applied from the recording voltage setting circuit 11 to one of the address lines connected to the gate electrode. Further, the bit line 84 is connected to the midpoint of connection between the source electrode of the n-type MOS transistor 86 and the drain electrode of the n-type MOS transistor 87. The drain electrode of the n-type MOS transistor 86 is connected to the high-potential side of the power supply and the source electrode of the n-type MOS transistor 87 is connected to the low-potential side of the power supply via a resistance element 87R.

When the control circuit for constant current and constant voltage is connected to the bit line, not the word line, compared to the third embodiment in which the circuit is provided on the word line, the operation polarities of constant current and constant voltage are reversed. That is, the n-type MOS transistor 87 performs a constant-current operation when a current flows in the information memory device 81 from top to bottom (in the direction toward the n-type MOS transistor 82).

Conversely, the n-type MOS transistor 86 performs a constant-voltage operation when a current flows in the information memory device 81 from bottom to top (in the direction toward the word line 83). In this regard, the n-type MOS transistor 86 performs a source follower operation, and the voltage applied to the information memory device 81 is near a constant voltage. The voltage applied to the information memory device 81 can be controlled by the voltage applied to the gate electrodes of the n-type MOS transistors 86, 87.

In the embodiment, the n-type MOS transistor 86 performs the constant-voltage operation when information in the high-resistance state is recorded, and the n-type MOS transistor 87 performs the constant-current operation when information in the low-resistance state is recorded. Further, in the configuration, one control circuit for constant current and constant voltage is connected to one bit line, not with respect to each information memory device, the number of MOS transistors can be reduced compared to the first and second embodiments and the circuit size can be kept small.

Note that the above explanation is applied to the n-type MOS transistors, however, when p-type MOS transistors are used in place of the n-type MOS transistors, the same operation may be performed if the low-potential power supply and the high-potential power supply are exchanged opposite to the case of the n-type MOS transistors.

In the above described first to fourth embodiments, the recording circuits (control circuits) including the minimum number of MOS transistors have been shown, however, the larger number of MOS transistors may be combined, or voltage control circuits and current control circuits with high accuracy may be formed using differential amplifiers and feedback circuits. Further, the gate voltage of one of the MOS transistors between the information memory device and the power supply may be controlled with reference to the voltage applied to or the current flowing in the information memory device.

Further, the spin MRAM has been explained as an example, however, the embodiments may be applied to non-volatile memories including information memory devices having other resistance changes. For example, in the case of an RRAM, the information memory device includes an oxide and metal electrodes, information corresponds to the ion state or crystal state of the oxide, and recording of the information is performed according to the above described methods.

Others

Examples of Measurement Data

Figure 11:
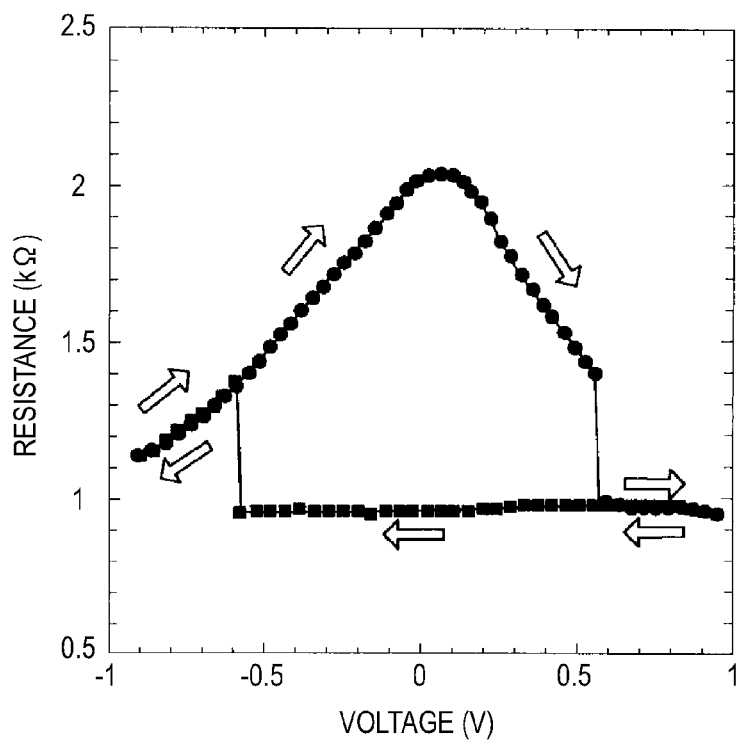
FIG. 11 is a graph showing voltage-resistance curves of an element for spin MRAM used in a working example.

Here, in the configurations of the information memory devices according to the embodiments of the application, how recording and destruction properties are going to be for specific recording methods have been studied. First, a result of verification of an element of spin MRAM is shown. The used element is a TMR element using Ta in 5 nm for a fundamental layer (the fundamental film 20 in FIG. 2), PtMn in 20 nm for an antiferromagnetic layer (the antiferromagnetic layer 21), CoFe in 2 nm for a pin layer (the ferromagnetic layer 22), Ru in 0.8 nm for an antiferromagnetic coupling layer (the nonmagnetic layer 23), CoFeB in 2 nm for a reference layer (the ferromagnetic layer 24), MgO in 0.8 nm for a tunnel barrier layer (the tunnel insulating layer 25), CoFeB in 1.8 nm for a recording layer (the ferromagnetic layer 26), and Ta in 5 nm for a protective layer (the topcoat layer 27). The element size is 75 nm in the short axis and 200 nm in the long axis. FIG. 11 shows representative voltage-resistance curves of the TMR element.

From FIG. 11, the reversal voltage is about 0.6 V for the positive and negative voltages, and the resistance value at the reversal voltage is about $0.95\Omega$ in the case of low resistance and $1.4\Omega$ in the case of high resistance.

Figure 12:
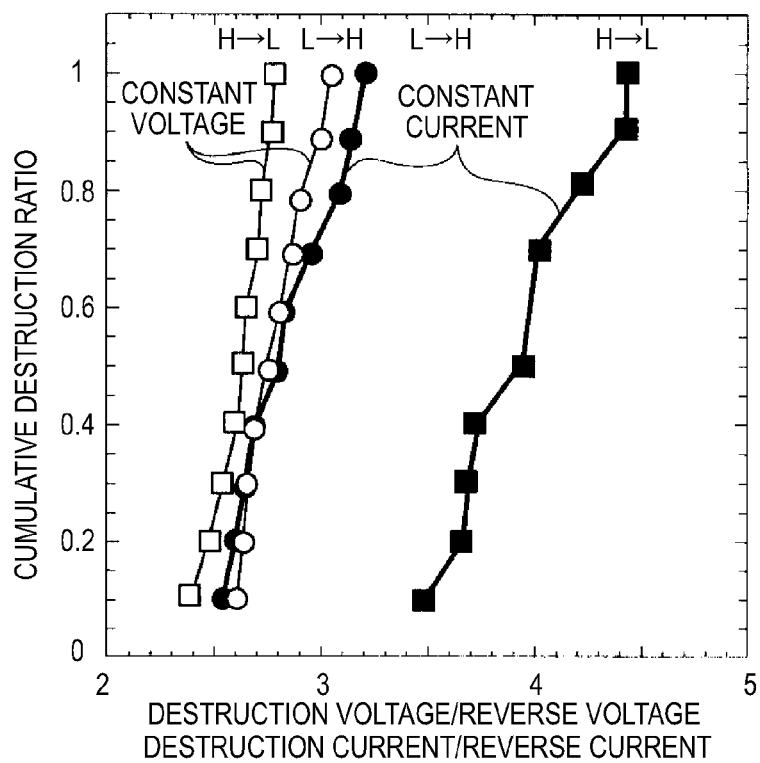
FIG. 12 is a graph showing cumulative destruction ratios of elements for spin MRAM used for measurement.

Regarding plural TMR elements having the same configuration as that of the TMR element, reversal and destruction are measured in constant-voltage recording and constant-current recording. FIG. 12 shows a graph showing breakdown voltage/reversal voltage and breakdown current/reversal current along the horizontal axis and cumulative destruction ratio along the vertical axis. In FIG. 12, H (high)→L (low) indicates recording from the high-resistance state to the low-resistance state and L→H indicates recording from the low-resistance state to the high-resistance state. The larger the value of the cumulative destruction ratio, that is, the closer to "1", the closer to complete destruction.

In the example of FIG. 12, the margin between destruction and recording is widest at H→L recording with constant current, and there is not so much difference in other recording operations.

Figure 13:
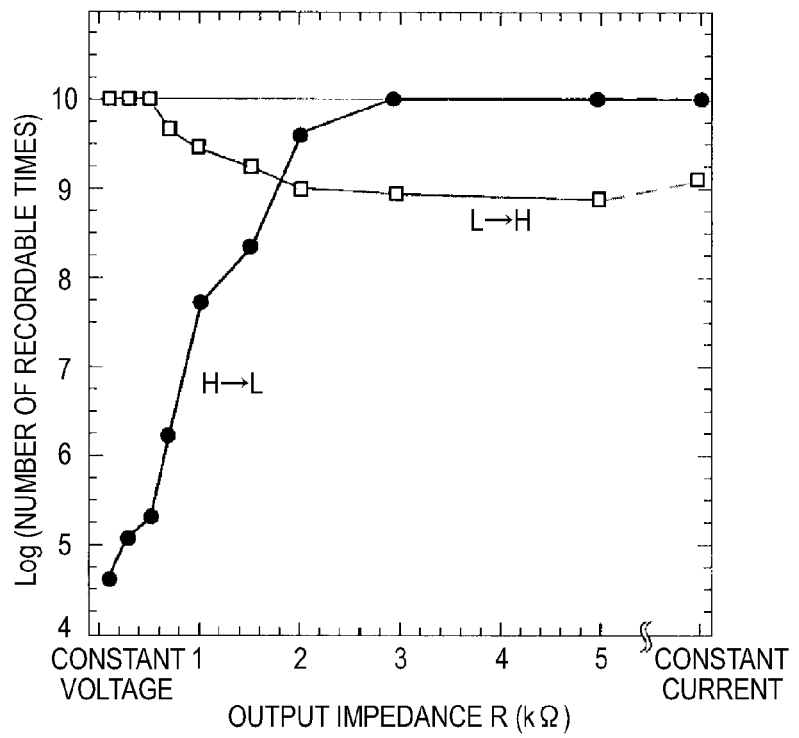
FIG. 13 is a graph showing changes of numbers of recordable times for the impedance of the recording circuit of elements for spin MRAM used for measurement.

Next, the numbers of recordable times for output impedances (R) have been measured by series-connecting a constant-voltage amplifier, a variable resistance element, and an information memory device, changing the value of the variable resistance to change the output impedance of a recording circuit (not shown) for driving the information memory device. FIG. 13 shows the logarithm of the number of recordable times for output impedance. Since the voltage, current applied to the information memory device changes depending on the output impedance, the voltage is referred to the drive input voltage of the constant-voltage amplifier and a dedicated circuit is used with a constant current. Pulses in 100 ns are input to the drive circuit, erasing is performed at a voltage 1.5 times the reversal input voltage under the respective conditions in this regard, the process of performing recording at a twice voltage is repeated at 1010 times at the maximum, and the number of times until the information memory device is destructed is used as the number of recordable times.

In the example of FIG. 13, the number of recordable times of L→H gradually decreases as the output impedance becomes larger, and, by contrast, the number of recordable times of H→L greatly increases as the output impedance becomes larger. That is, the smaller output impedance for L→H and the larger output impedance for H→L are preferable because the number of recordable times is larger. In the case where recording is performed both for L→H, H→L with the same output impedance, it is relatively good that the output impedance is about 1 to 2 k$\Omega$ lower than the resistance value of the high-resistance state and higher than the resistance value of the low-resistance state. It is more preferable to change the recording condition such that the recording for L→H is performed with the lower impedance, i.e., by the constant-voltage operation and the recording for H→L is performed with the higher impedance, i.e., by the constant-current operation.

Figure 14:
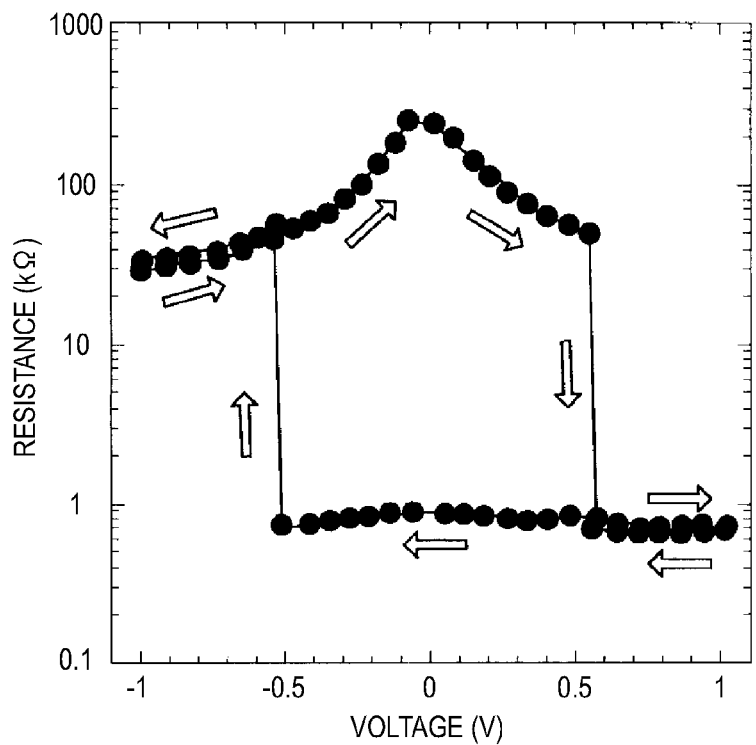
FIG. 14 is a graph showing voltage-resistance curves of an element for RRAM used for measurement.

Next, data examples acquired using an information memory device of RRAM including an oxide having a larger resistance change rate sandwiched between metal layers are shown. The information memory device of RRAM is formed in a diameter of 50 nm using NiO in a thickness of 30 nm is used as the oxide, Pt in a thickness of 10 nm is used as the lower electrode of the oxide, and Ta in a thickness of 10 nm is used as the upper electrode of the oxide. FIG. 14 shows voltage-resistance curves of the element of RRAM used.

Compared to the information memory device using the above described spin MRAM, the resistance change between the low-resistance state and the high-resistance state is as large as 20 to 200 times. The measurement of recording has been performed using the same circuit configuration with the above described spin MRAM, however, another circuit than that for recording has been prepared for erasing. In the measurement, in the case where the low-resistance state is recorded, recording is performed after erasing for high resistance is performed, and, in the case where the high-resistance state is recorded, recording is performed after erasing for low resistance is performed. The recording is performed by applying a voltage 1.5 times the reverse voltage to the drive circuit and repeated $10^{10}$ times at the maximum, and the number of times until the information memory device is destructed is used as the number of recordable times.

Figure 15:
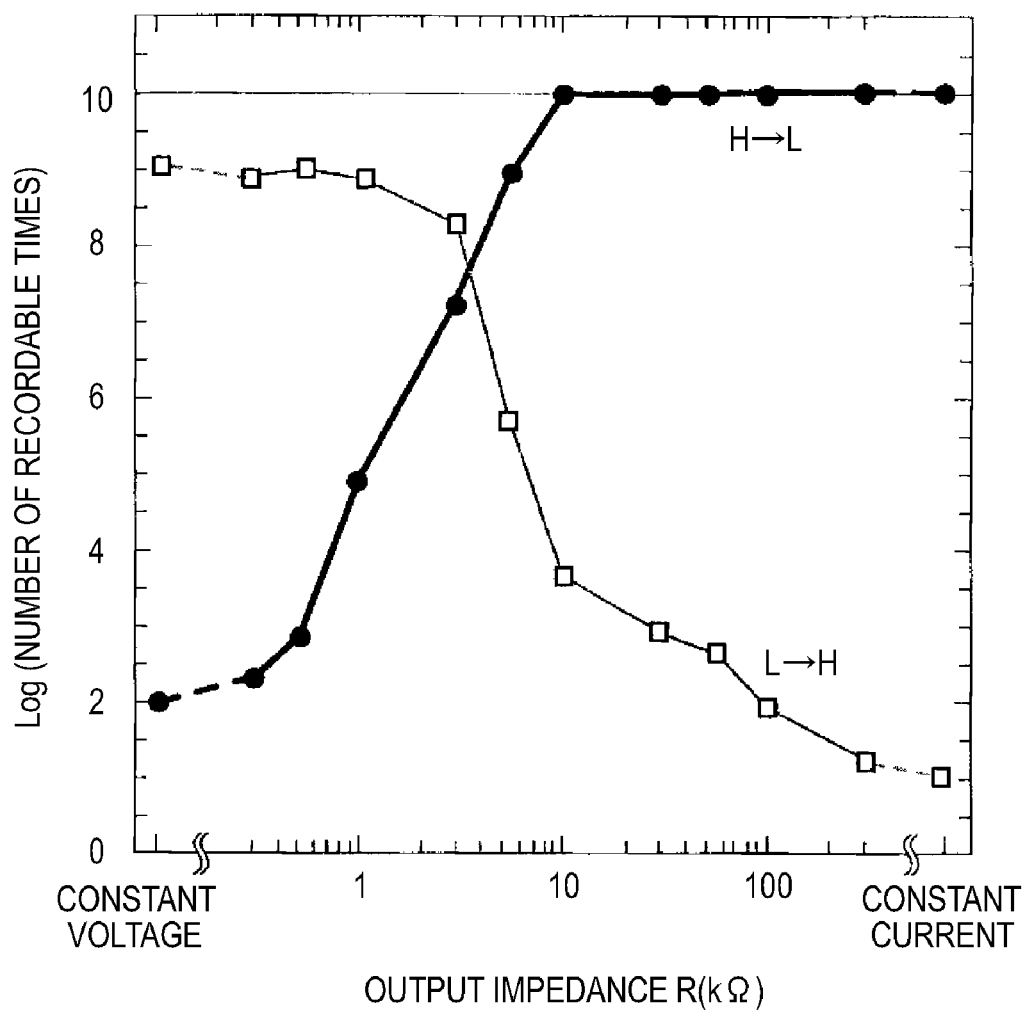
FIG. 15 is a graph showing changes of numbers of recordable times for the impedance of the recording circuit of elements for RRAM used for measurement.

FIG. 15 shows logarithm of numbers of recordable times for output impedance. For recording, a recording circuit having the same configuration as that used for measurement of the above described spin MRAM is used. In the drawing, H→L indicates data at recording from the high-resistance state to the low-resistance state and L→H indicates data at recording from the low-resistance state to the high-resistance state. The number of recordable times for L→H decreases as the output impedance becomes larger, and the number of recordable times for H→L greatly increases as the output impedance becomes smaller. In the case where recording is performed both for L→H, H→L with the same output impedance, it is relatively good that the output impedance is about 3 kΩ lower than the resistance value of the high-resistance state and higher than the resistance value of the low-resistance state. It is more preferable to change the recording condition such that the recording for L→H is performed with the lower impedance, i.e., by the constant-voltage operation and the recording for H→L is performed with the higher impedance, i.e., by the constant-current operation.

As the above shown measurement data, when the low-resistance state is recorded in both the information memory device for spin MRAM and the information memory device for RRAM, recording is performed with an impedance higher than the resistance value of the low-resistance state to be recorded, more preferably, with a constant current. On the other hand, when the high-resistance state is recorded, recording is performed with an impedance lower than the resistance value of the high-resistance state to be recorded, more preferably, with a constant voltage, and thereby, the number of recordable times greatly increases and the reliability of the nonvolatile memory is improved.

A nonvolatile memory including the recording methods of the embodiments of the application represented by the first to fourth embodiments and a configuration that realizes recording methods has a configuration that realizes the above described recording operations. That is, when the low-resistance state is recorded, recording (constant current recording) is performed with an impedance higher than the resistance value of the low-resistance state to be recorded. On the other hand, when the high-resistance state is recorded, recording (constant voltage recording) is performed with an impedance lower than the resistance value of the high-resistance state to be recorded. According to the configuration, the load on the information memory device is reduced and destruction of the information memory device is suppressed. Thus, the number of recordable times greatly increases and the reliability of the nonvolatile memory is improved.

Note that the above described embodiments are specific examples of preferred embodiments for implementing the application, and technically preferable various limitations are added. However, the application is not limited to these embodiments unless there is any specific description that limits the application in the above described explanation of the embodiments. For example, the used materials cited in the above described explanation and the amounts of use, processing time, processing order, numeric conditions of respective parameters, etc. are only preferred examples, and dimensions, shapes, arrangement relations, etc. in the respective drawings used for the explanation schematically show examples of the embodiments. Therefore, the application is not limited to the examples of the above described embodiments, and various modifications, changes can be made without departing from the scope of the application.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The invention claimed is:

1. A recording method of a nonvolatile memory including a recording circuit that electrically performs recording of information for an information memory device having a resistance change connected to a power supply for information recording, the method comprising the steps of:
   recording information in a low-resistance state by the recording circuit under a condition that an output impedance of the recording circuit for the information memory device is larger than a resistance value in the low-resistance state of the information memory device; and
   recording information in a high-resistance state by the recording circuit under a condition that an output impedance of the recording circuit for the information memory device is smaller than a resistance value in the high-resistance state of the information memory device, and
   wherein, when the information in the low-resistance state is recorded, control of the recording is performed by current control, and, when the information in the high-resistance state is recorded, control of the recording is performed by voltage control.

2. The recording method of the nonvolatile memory according to claim 1, wherein, when the information in the low-resistance state is recorded, constant-current recording is performed, and, when the information in the high-resistance state is recorded, constant-voltage recording is performed.

3. A recording method of a nonvolatile memory including a recording circuit that electrically performs recording of information for an information memory device having a resistance change connected to a power supply for information recording, the method comprising the steps of:
   recording information in a low-resistance state by the recording circuit under a condition that an output impedance of the recording circuit for the information memory device is larger than a resistance value in the low-resistance state of the information memory device; and
   recording information in a high-resistance state by the recording circuit under a condition that an output impedance of the recording circuit for the information memory device is smaller than a resistance value in the high-resistance state of the information memory device,
   wherein, when information to be recorded is determined depending on positive or negative polarity of a recording voltage, recording is performed on one polarity by current control and on the other polarity by voltage control.

4. A recording method of a nonvolatile memory including a recording circuit that electrically performs recording of information for an information memory device having a resistance change connected to a power supply for information recording, the method comprising the steps of:
   recording information in a low-resistance state by the recording circuit under a condition that an output impedance of the recording circuit for the information memory device is larger than a resistance value in the low-resistance state of the information memory device; and
   recording information in a high-resistance state by the recording circuit under a condition that an output impedance of the recording circuit for the information memory device is smaller than a resistance value in the high-resistance state of the information memory device,
   wherein, the information memory device includes a magnetic material as a component element, and the information is recorded in response to a magnetic state of the magnetic material.

5. A recording method of a nonvolatile memory including a recording circuit that electrically performs recording of information for an information memory device having a resistance change connected to a power supply for information recording the method comprising the steps of:

recording information in a low-resistance state by the recording circuit under a condition that an output impedance of the recording circuit for the information memory device is larger than a resistance value in the low-resistance state of the information memory device; and recording information in a high-resistance state by the recording circuit under a condition that an output impedance of the recording circuit for the information memory device is smaller than a resistance value in the high-resistance state of the information memory device, wherein the information memory device includes an oxide and metal electrodes, and the information is recorded in response to an ion state or a crystal state of the oxide.

* * * * *